United States Patent
Cai et al.

(10) Patent No.: US 12,106,985 B2
(45) Date of Patent: Oct. 1, 2024

(54) LASER DICING SYSTEM AND METHOD FOR DICING SEMICONDUCTOR STRUCTURE INCLUDING CUTTING STREET

(71) Applicant: YANGTZE MEMORY TECHNOLOGIES CO., LTD., Wuhan (CN)

(72) Inventors: Liquan Cai, Wuhan (CN); Peng Chen, Wuhan (CN); Houde Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 537 days.

(21) Appl. No.: 17/307,944

(22) Filed: May 4, 2021

(65) Prior Publication Data

US 2022/0319888 A1    Oct. 6, 2022

Related U.S. Application Data

(63) Continuation of application No. PCT/CN2021/084412, filed on Mar. 31, 2021.

(51) Int. Cl.
*H01L 21/67* (2006.01)
*B23K 26/364* (2014.01)
(Continued)

(52) U.S. Cl.
CPC ...... *H01L 21/67282* (2013.01); *B23K 26/364* (2015.10); *H01L 21/268* (2013.01);
(Continued)

(58) Field of Classification Search
CPC . H01L 21/67282; H01L 22/20; H01L 23/544; H01L 2223/544; H01L 2223/5442;
(Continued)

(56) References Cited

U.S. PATENT DOCUMENTS

| 4,555,610 A | 11/1985 | Polad et al. |
| 5,278,385 A | 1/1994 | Gerome et al. |

(Continued)

FOREIGN PATENT DOCUMENTS

| CN | 1567007 A | 1/2005 |
| CN | 1577755 A | 2/2005 |

(Continued)

OTHER PUBLICATIONS

International Search Report issued in corresponding International Application No. PCT/CN2021/084445, mailed Jan. 10, 2022, 4 pages.

(Continued)

*Primary Examiner* — John P. Dulka
(74) *Attorney, Agent, or Firm* — BAYES PLLC

(57) ABSTRACT

A laser dicing system is disclosed. The laser dicing system includes a host device and a laser source. The host device reads and identifies a mark formed on a surface of a semiconductor structure. The laser source is coupled to the host device and is configured to generate a dicing laser energy to form a trench on the semiconductor structure. The dicing laser energy irradiated on the semiconductor structure is adjustable based on information embedded in the mark.

20 Claims, 11 Drawing Sheets

(51) Int. Cl.
  *H01L 21/268* (2006.01)
  *H01L 21/66* (2006.01)
  *H01L 21/78* (2006.01)
  *H01L 23/544* (2006.01)
(52) U.S. Cl.
  CPC .. *H01L 21/67092* (2013.01); *H01L 21/67115* (2013.01); *H01L 21/78* (2013.01); *H01L 22/20* (2013.01); *H01L 23/544* (2013.01); *H01L 2223/5442* (2013.01)
(58) Field of Classification Search
  CPC ... H01L 2223/54433; H01L 2223/5444; H01L 2223/54446; H01L 2223/54453; H01L 2223/5446; H01L 21/268; B23K 26/362; B23K 2103/56; B23K 26/38; B23K 26/402; B23K 26/046; B23K 26/702
  See application file for complete search history.

(56) References Cited

U.S. PATENT DOCUMENTS

| | | | |
|---|---|---|---|
| 9,842,740 B2 * | 12/2017 | Mastain | B23K 26/032 |
| 2001/0054606 A1 | 12/2001 | Weishauss et al. | |
| 2003/0006221 A1 | 1/2003 | Hong et al. | |
| 2004/0252291 A1 | 12/2004 | Schutze | |
| 2008/0220590 A1 | 9/2008 | Miller et al. | |
| 2014/0245608 A1 | 9/2014 | Morimoto et al. | |
| 2019/0224778 A1 | 7/2019 | Murphy et al. | |

FOREIGN PATENT DOCUMENTS

| | | |
|---|---|---|
| CN | 101318264 A | 12/2008 |
| CN | 1577755 B | 5/2010 |
| CN | 102822952 A | 12/2012 |
| CN | 103567630 A | 2/2014 |
| CN | 103934576 A | 7/2014 |
| CN | 203980014 U | 12/2014 |
| CN | 104411446 A | 3/2015 |
| CN | 105345282 A | 2/2016 |
| CN | 106735876 A | 5/2017 |
| CN | 106938370 A | 7/2017 |
| CN | 108080798 A | 5/2018 |
| CN | 108515273 A | 9/2018 |
| CN | 108701678 A | 10/2018 |
| CN | 110014227 A | 7/2019 |
| CN | 110064841 A | 7/2019 |
| CN | 110102879 A | 8/2019 |
| CN | 111940892 A | 11/2020 |
| JP | 2005118832 A | 5/2005 |
| JP | 2007266420 A | 10/2007 |

OTHER PUBLICATIONS

International Search Report issued in corresponding International Application No. PCT/CN2021/084412, mailed Dec. 30, 2021, 5 pages.

* cited by examiner

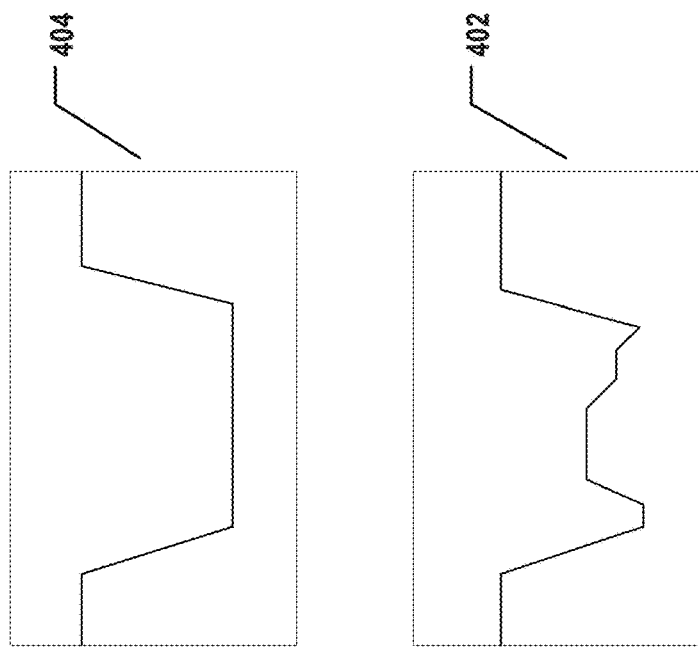
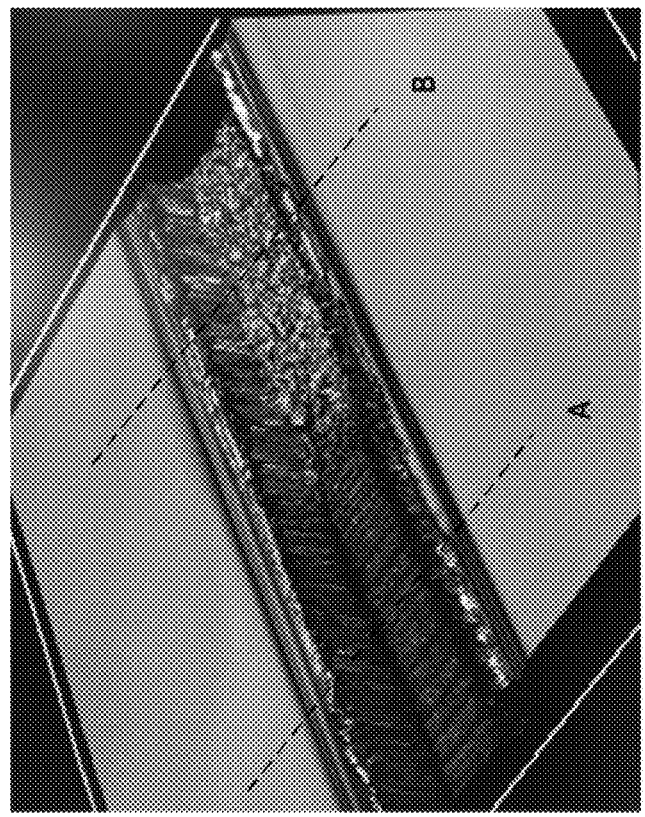
FIG. 4

LASER DICING SYSTEM AND METHOD FOR DICING SEMICONDUCTOR STRUCTURE INCLUDING CUTTING STREET

CROSS-REFERENCE TO RELATED APPLICATIONS

This application is continuation of International Application No. PCT/CN2021/084412, filed on Mar. 31, 2021, entitled "LASER DICING SYSTEM AND METHOD FOR DICING SEMICONDUCTOR STRUCTURE," which is hereby incorporated by reference in its entirety. This application is also related to U.S. application Ser. No. 17/307,928, filed on May 4, 2021, entitled "LASER SYSTEM FOR DICING SEMICONDUCTOR STRUCTURE AND OPERATION METHOD THEREOF," which is hereby incorporated by reference in its entirety.

BACKGROUND

The present disclosure relates to laser dicing systems and methods for dicing semiconductor structures.

In semiconductor manufacturing, wafers or semiconductor structures are diced to separate dies that form integrated circuits. Common ways to dice wafers include mechanical sawing and laser dicing. The mechanical sawing methods often include employing a dicing saw to mechanically separate different dies in a wafer. The laser dicing methods often include directing the output of an ultra-short and pulsed high-power laser through optics. The mechanical sawing and the laser dicing may also be combined to separate dies. A dicing process can produce individual circuit chips (dies) that are further packaged to form desired circuits.

SUMMARY

Laser dicing systems and methods for dicing semiconductor structures are disclosed herein.

In one aspect, a laser dicing system is disclosed. The laser dicing system includes a host device and a laser source. The host device reads and identifies a mark formed on a surface of a semiconductor structure. The laser source is coupled to the host device and is configured to generate a dicing laser energy to form a trench on the semiconductor structure. The dicing laser energy irradiated on the semiconductor structure is adjustable based on information embedded in the mark.

In another aspect, a laser dicing system is disclosed. The laser dicing system includes a host device and a laser source. The host device stores information indicating a material category of a corresponding position on the semiconductor structure. The laser source is coupled to the host device and is configured to generate a dicing laser energy to form a trench on the semiconductor structure. The dicing laser energy irradiated on the semiconductor structure is adjustable based on the information indicating the material category of the corresponding position on the semiconductor structure.

In still another aspect, a method for dicing a semiconductor structure is disclosed. Information embedded in a mark formed on the semiconductor structure is read. The information indicates a material category of a corresponding position on the semiconductor structure. A laser dicing operation is performed based on the information indicating the material category of the corresponding position on the semiconductor structure.

In yet another aspect, a method for dicing a semiconductor structure is disclosed. Information indicating a material category of a corresponding position on the semiconductor structure is provided to a laser source. A laser dicing operation is performed by the laser source on the corresponding position on the semiconductor structure based on the information indicating the material category of the corresponding position on the semiconductor structure.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

FIG. 4 illustrates a scanning electron microscope image showing a cross-section of an exemplary cutting street formed on a semiconductor structure, according to some implementations of the present disclosure.

Figure 1:
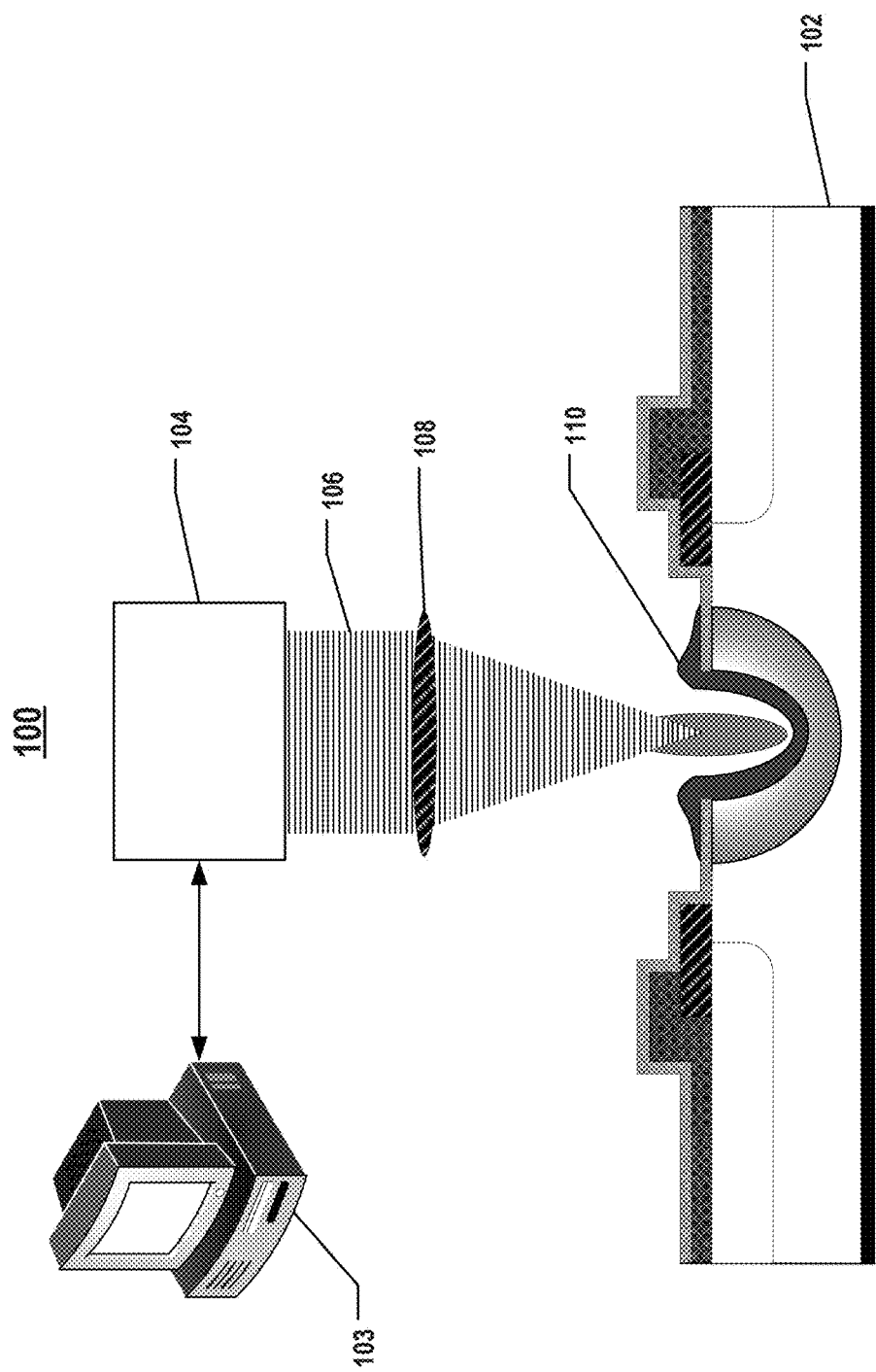
FIG. 1 illustrates a schematic diagram of an exemplary laser dicing system, according to some implementations of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The laser grooving process is performed to remove the metal or other complex materials on the cutting street, or called cutting channel, and ensure the consistency of the physical cutting environment of a subsequent mechanical cutting. The laser grooving process could reduce the reliability problems caused by chip collapse and improve the packaging yield of the integrated circuits.

FIG. 1 illustrates a schematic diagram of an exemplary laser dicing system 100, according to some implementations of the present disclosure. Laser dicing system 100 includes a host device 103 and a laser source 104.

Host device 103 may be a desktop computer, a laptop computer, a server, or any suitable devices. Host device 103 is coupled to laser source 104 through a physical cable, a wireless connection, internet, or any suitable connection methods. Laser source 104 may be any suitable type of laser source including, but not limited to, fiber lasers, solid-state lasers, gas lasers, and semiconductor lasers. Laser source 104 can be configured to generate a laser beam 106 that includes a series of pulsed lasers at any suitable wavelengths, which should be a permeable wavelength not strongly absorbed or reflected by a semiconductor structure 102. In the case of silicon wafer cutting, the wavelength may be longer than 1 μm to realize the internal laser ablation, making full use of the laser energy and avoiding any damage to the upper part of the wafer when a focused laser beam creates a dicing track inside semiconductor structure 102.

In some implementations, laser beam 106 generated by laser source 104 may have a single wavelength or a plurality of wavelengths, such as two or three different wavelengths. Laser beam 106 having different wavelengths may be separately, simultaneously, or alternatingly generated. In some implementations, the wavelength of the laser beam 106 generated by laser source 104 may be longer than 1 μm. In some implementations, the output frequency of laser source 104 is between 10 kHz and 1,000 kHz. In some implementations, the average output power of laser source 104 is between 5 W and 500 W. It is understood that the parameters of laser beam 106 and laser source 104 disclosed above are for illustrative purposes only and not for limiting.

In some implementations, a focusing unit 108 may be optically coupled to laser source 104 to provide a series of focused laser spots on semiconductor structure 102 based on the series of pulsed lasers generated by laser source 104. For example, the series of pulsed lasers can form a series of focused laser spots at a horizontal location on a focal plane. In some implementations, focusing unit 108 may be operatively coupled to a controller and receives control signals and instructions from the controller. In some implementations, focusing unit 108 may further include any other suitable scanning units, scanning mirrors, and scanning refractive optics.

Focusing unit 108 may be configured to focus each of the laser beam 106 to form a series of focused laser spots. In some implementations, focusing unit 108 may include one or more focusing lens through which the focal plane of the laser beam 106 is determined at a desired position along the z-axis (e.g., the vertical direction). In some implementations, the one or more focusing lenses are electrically and mechanically coupled to the controller to control the arrangement (e.g., orientation and distance in between) of the one or more focusing lens to allow the focal plane of laser beam 106 to be located at the desired position along the z-axis. The series of focused laser spots can be formed on the focal plane, forming ablation structures 110 in semiconductor structure 102.

Figure 2:
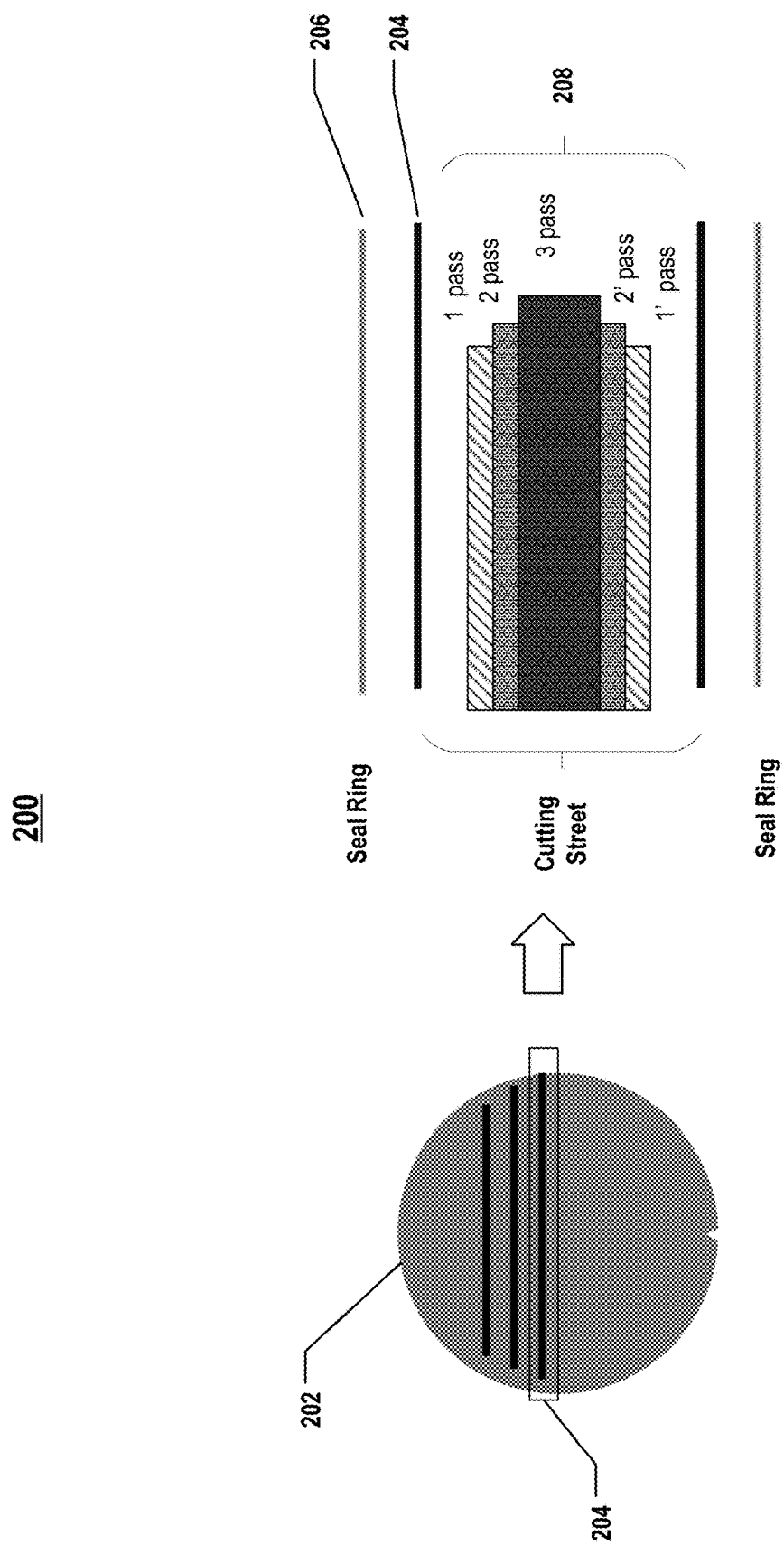
FIG. 2 illustrates a top view of an exemplary cutting street formed on a semiconductor structure, according to some implementations of the present disclosure.
Figure 3:
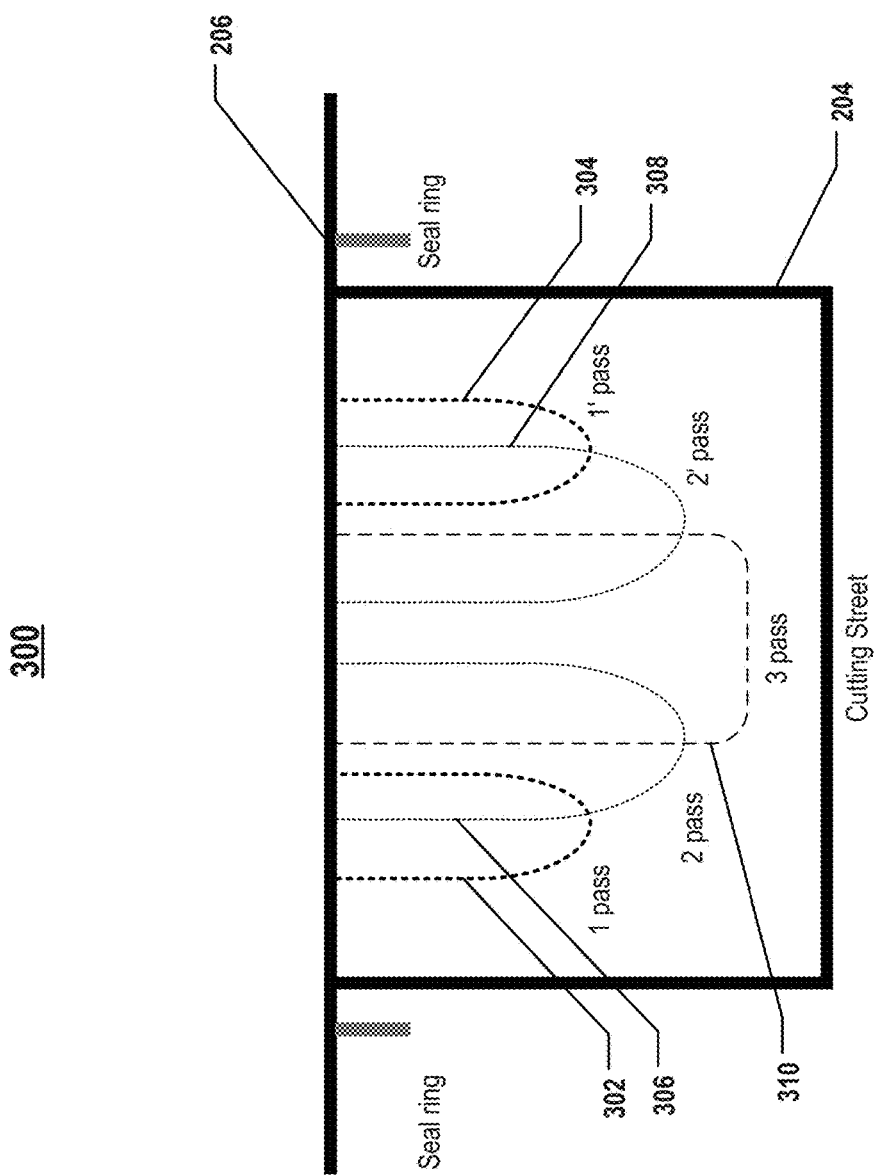
FIG. 3 illustrates a cross-section of an exemplary cutting street formed on a semiconductor structure, according to some implementations of the present disclosure.

FIG. 2 illustrates a top view 200 of an exemplary cutting street 204 formed on a semiconductor structure 202, according to some implementations of the present disclosure. FIG. 3 illustrates a cross-section 300 of cutting street 204 formed on semiconductor structure 202, according to some implementations of the present disclosure. For the purpose of better explaining the present disclosure, top view 200 of cutting street 204 in FIG. 2 and cross-section 300 of cutting street 204 in FIG. 3 will be described together. In some implementations, semiconductor structure 202 may be a wafer. In some implementations, the chips (dies) on semiconductor structure 202 are surrounded by seal rings 206, and cutting street 204 is used to dice semiconductor structure 202 without damaging seal rings 206. In some implementations, seal rings 206 may include metal materials.

When performing the laser dicing, a plurality of laser sources may generate a plurality of dicing laser energy, and the dicing energy may be irradiated on semiconductor structure 202 sequentially. As shown in FIG. 2, a laser dicing track 208 may include a plurality of laser tracks performed by a plurality of laser sources sequentially. It is understood that the plurality of laser sources may be applied simultaneously on semiconductor structure 202 based on different designs of the dicing system. By controlling the movement of laser source 104 and focusing unit 108 in FIG. 1, laser dicing track 208 may be limited in the range of cutting street 204 without damaging seal rings 206.

In some implementations, laser dicing track 208 may be formed by laser tracks 302, 304, 306, 308, and 310, as shown in FIG. 3. In some implementations, laser tracks 302 and 304 may be formed by two laser sources having the same energy. In some implementations, laser tracks 302 and 304 may be formed by two laser sources having different energies. In some implementations, laser tracks 302 and 304 may be formed by a same laser source sequentially. In some implementations, laser tracks 302 and 304 may be formed by a same laser source simultaneously. In some implementations, laser tracks 302 and 304 may be formed by a same laser source split by a splitter simultaneously. In some implementations, laser tracks 306 and 308 may be formed by two laser sources having the same energy. In some implementations, laser tracks 306 and 308 may be formed by two laser sources having different energies. In some implementations, laser tracks 306 and 308 may be formed by a same laser source sequentially. In some implementations, laser tracks 306 and 308 may be formed by a same laser source simultaneously. In some implementations, laser tracks 306 and 308 may be formed by a same laser source split by a splitter simultaneously.

In some implementations, laser track 310 is deeper than laser tracks 306 and 308. In some implementations, laser tracks 306 and 308 are deeper than laser tracks 302 and 304. As shown in FIG. 3, the combination of the plurality of laser tracks 302, 304, 306, 308, and 310 forms a trench, and the mechanical cutting may be later performed on semiconductor structure 202 along the cutting street having the trench.

FIG. 4 illustrates a scanning electron microscope image 400 showing a cross-section of cutting street 204 formed on semiconductor structure 202, according to some implementations of the present disclosure. Due to the materials formed on different positions of semiconductor structure 202 are various, cutting street 204 may extend along a line having different materials. For example, semiconductor structure 202 is a wafer, and cutting street 204 may cross a plurality of areas having different metal material, different dielectric materials, or other materials. When using laser source 104 to perform the laser dicing, cutting street 204 may have different depths or rough profiles.

A cross-section 402 along line A across cutting street 204 and a cross-section 404 along line B across cutting street 204 are shown in FIG. 4. Line A across cutting street 204 may be located at a position having hard metal material or having several different metal materials, and line B across cutting street 204 may be located at a position having soft metal material or non-metal materials. As shown in FIG. 4, cross-section 402 has a rough profile, and the depth of cross-section 402 is shallower than the depth of cross-section 404.

Figure 5:
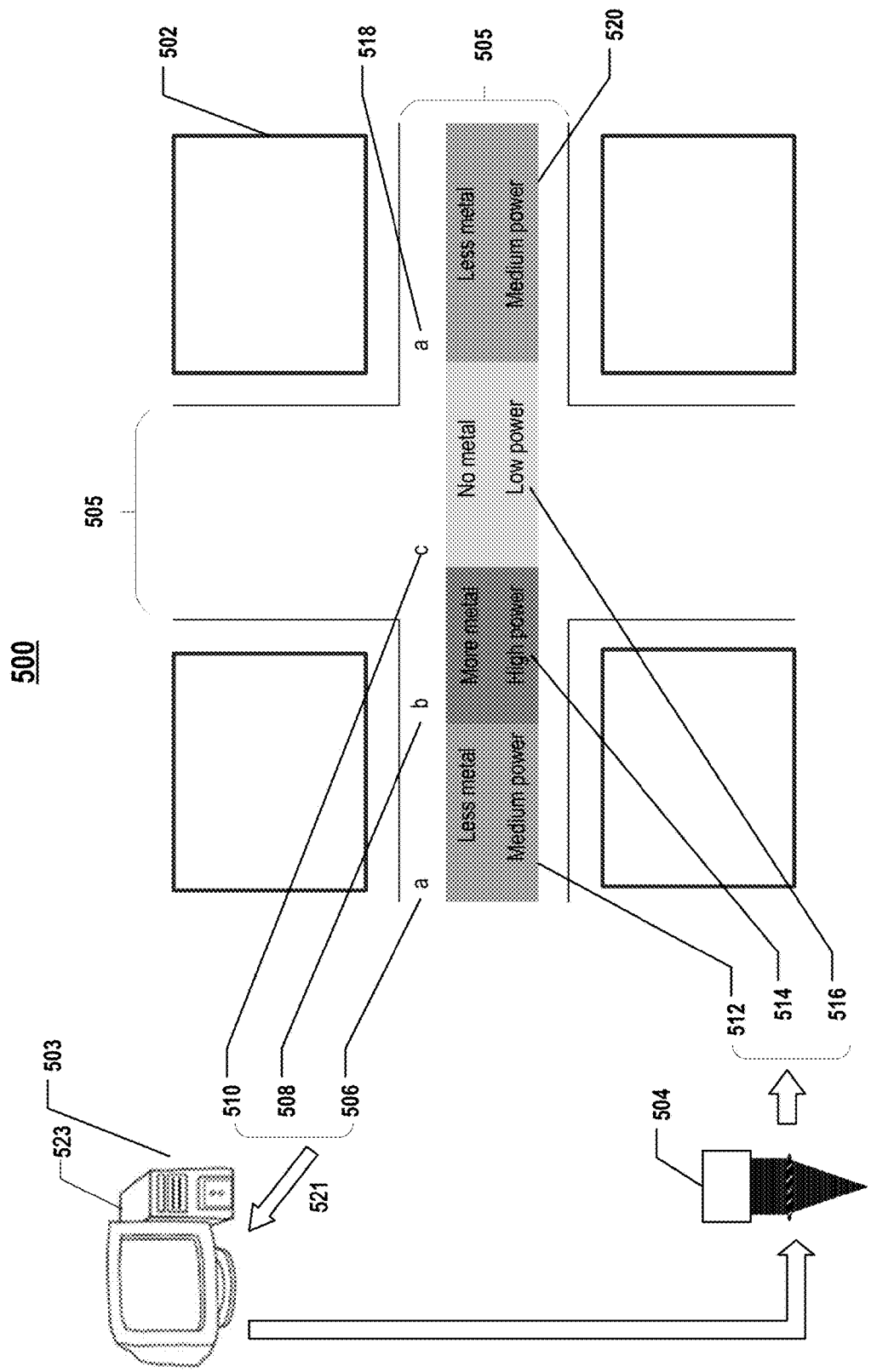
FIG. 5 illustrates a schematic diagram of an exemplary laser dicing system, according to some implementations of the present disclosure.
Figure 6:
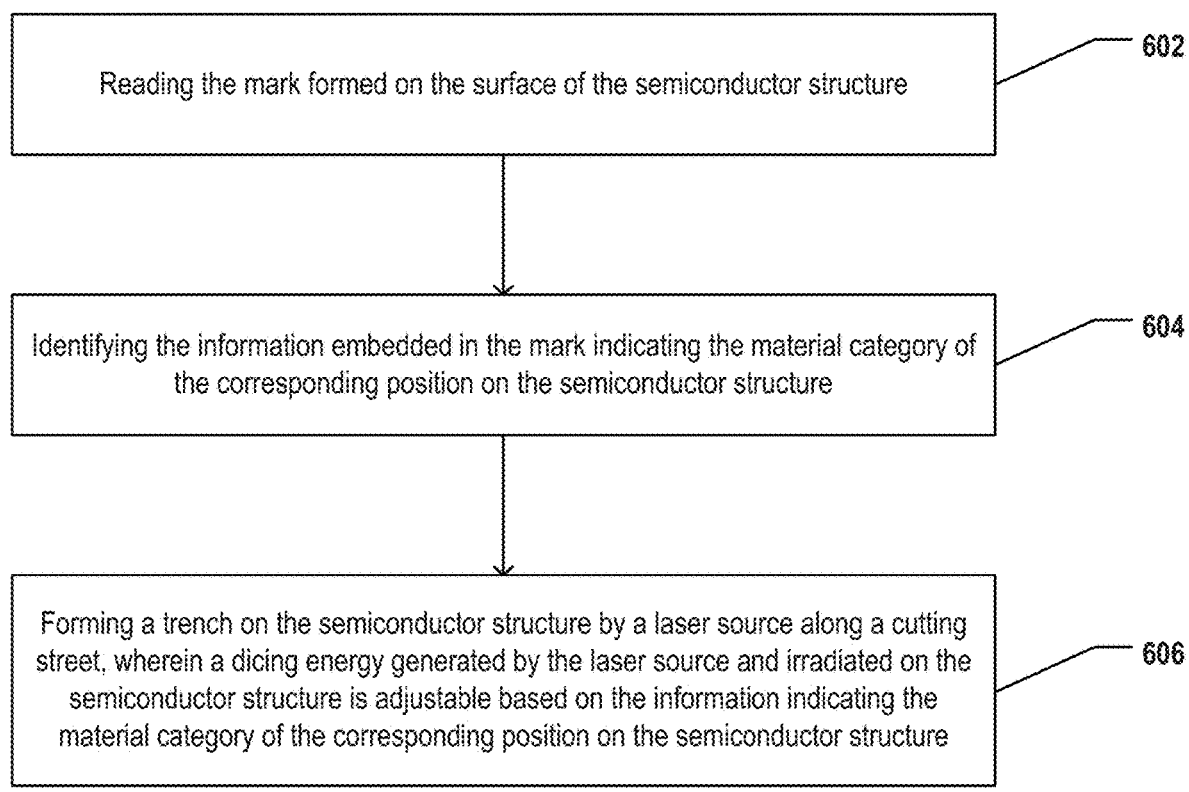
FIG. 6 illustrates a flowchart of a method for dicing a semiconductor structure, according to some aspects of the present disclosure.

FIG. 5 illustrates a schematic diagram of a laser dicing system 500, according to some implementations of the present disclosure. FIG. 6 illustrates a flowchart of a method 600 for dicing a semiconductor structure, according to some aspects of the present disclosure. For the purpose of better explaining the present disclosure, laser dicing system 500 in FIG. 5 and method 600 in FIG. 6 for dicing a semiconductor structure will be described together.

Laser dicing system 500 includes a host device 503 and a laser source 504. In some implementations, host device 503 may be similar to host device 103 in FIG. 1, and laser source 504 may be similar to laser source 104 in FIG. 1. Host device 503 may include an image capture unit 521 and an image identification unit 523. Image capture unit 521 may be a camera, a scanner, a charge-coupled device (CCD) or complementary metal oxide semiconductor (CMOS) sensor, or other suitable devices for read marks 506, 508 and 510 formed on the surface of the semiconductor structure. Image identification unit 523 may include a processor that can run software code stored in a memory for image detection. For example, the image detection may be achieved by any suitable pattern recognition algorithms that can recognize read marks 506, 508 and 510, including, but not limited to, classification, clustering, ensemble learning, arbitrarily structured labels, multilinear subspace learning, real-valued sequence labeling, regression, and sequence labeling. The processor may include, for example, a central processing unit (CPU), a graphic processing unit (GPU), a digital signal processor (DSP), a neural processing unit (NPU), or any combinations thereof As shown in operation 602 of FIG. 6, marks 506, 508, and 510 formed on the surface of the semiconductor structure is read by the image capture unit. Marks 506, 508, and 510 may be a letter as shown in FIG. 5. In some implementations, marks 506, 508, and 510 may be a number, a graphic, a symbol or other markings capable of embedding information. Marks 506, 508, and 510 may formed in an area within a cutting street 505, as shown in FIG. 5. In some implementations, marks 506, 508, and 510 may be formed in an area between cutting street 505 and chips 502, e.g., between a seal ring and cutting street 505. In some implementations, marks 506, 508 and 510 may be formed in a pre-defined area on the surface of the semiconductor structure, e.g., a pre-defined corner of the semiconductor structure.

After reading marks 506, 508, and 510, image identification unit 523 may identify the information embedded in marks 506, 508, and 510, as shown in operation 604 of FIG. 6. The information embedded in marks 506, 508, and 510 may indicate a material category of a corresponding position on the semiconductor structure. For example, mark 506 may have the information indicating the material of a position 512 on the semiconductor structure, as shown in FIG. 5. In some implementations, mark 506 may have the information indicating the material of position 512 on the semiconductor structure contains less metal. In some implementations, mark 508 may have the information indicating the material of a position 514 on the semiconductor structure contains more metal. In some implementations, mark 510 may have the information indicating the material of a position 516 on the semiconductor structure contains no metal. Hence, laser source 504 may perform the laser dicing operation according to the information.

The information indicating the material of positions 512, 514, and 516 on the semiconductor structure may be a position of cutting street 505 on the semiconductor structure, the material category along cutting street 505, a material density of each material of the material category, or a laser energy for dicing each material of the material category. In some implementations, different materials having similar material density or requiring similar laser energy to dice may be pre-categorized to a same material category. For example, position 512 and a position 520 may contain different materials but have similar metal density and require the same laser energy to dice and may be pre-categorized to a same material category. Mark 506 and a mark 518 may indicate a same material category of positions 512 and 520 on the semiconductor structure, and laser source 504 may perform the laser dicing operation with the same laser energy to dice at positions 512 and 520.

Then, laser source 504 may form a trench on the semiconductor structure along cutting street 505, as shown in operation 606 of FIG. 6. The dicing energy irradiated on the semiconductor structure is adjustable based on the information indicating the material category of the corresponding position on the semiconductor structure. In some implementations, the laser energy output by laser source 504 is adjustable. In some implementations, the laser energy output by laser source 504 is fixed, and a laser energy adjusting unit may be attached to laser dicing system 500 to adjust the dicing energy irradiated on the semiconductor structure.

Figure 7:
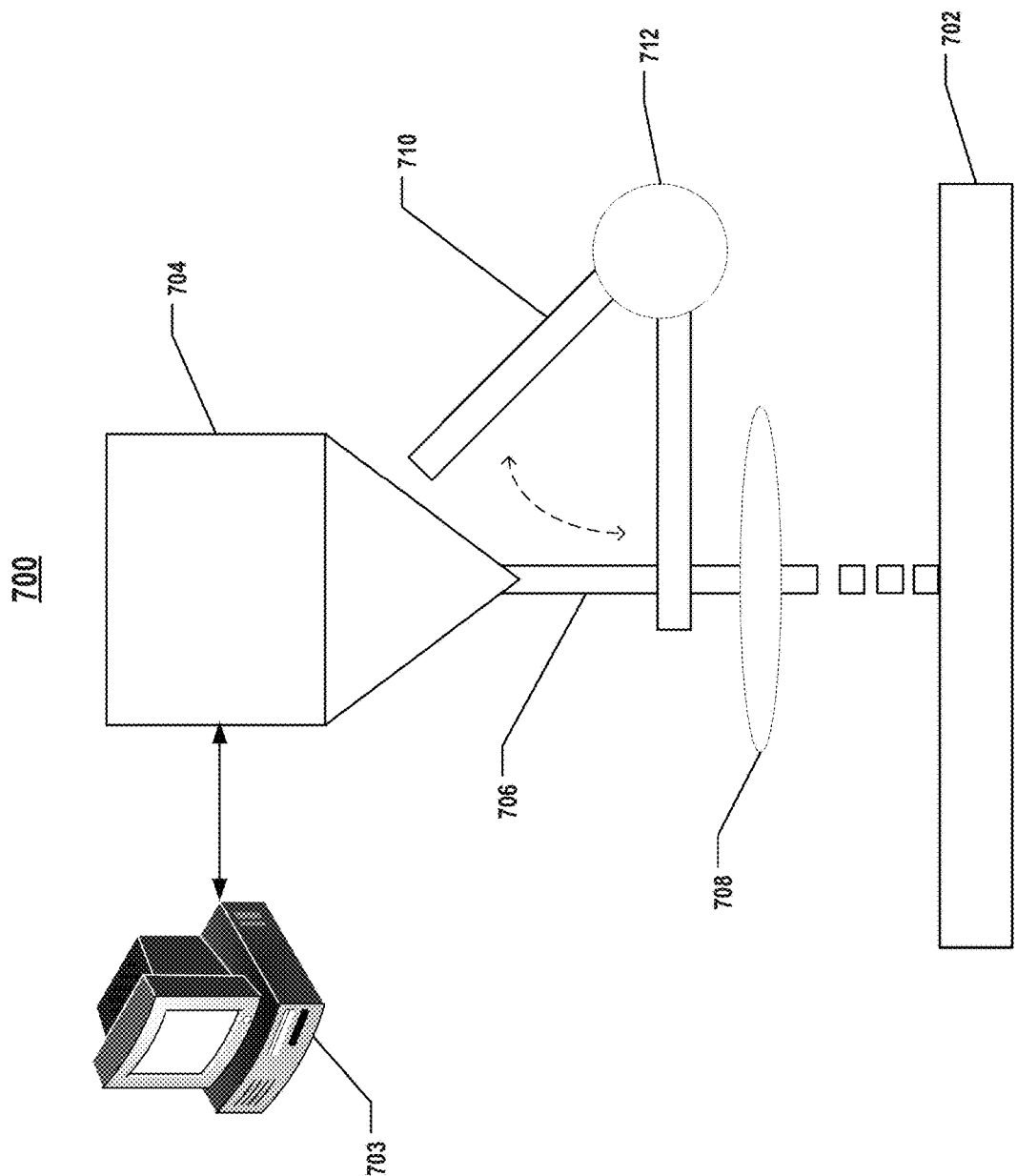
FIG. 7 illustrates a diagram of another exemplary laser dicing system, according to some implementations of the present disclosure.

FIG. 7 illustrates a diagram of a laser dicing system 700, according to some implementations of the present disclosure. Laser dicing system 700 includes a host device 703, a laser source 704, a laser energy adjusting unit 710, a positioning unit 712, and a focusing unit 708. In some implementations, host device 703 may be similar to host device 103 in FIG. 1. Laser source 704 is coupled to host device 703 and may be any suitable type of laser source including, but not limited to, fiber lasers, solid-state lasers, gas lasers, and semiconductor lasers. Laser source 704 can be configured to generate a laser beam 706 that includes a series of pulsed lasers at any suitable wavelengths, which should be a permeable wavelength not strongly absorbed or reflected by semiconductor structure 702.

Laser energy adjusting unit 710 may be movably provided on a laser light path between laser source 704 and the semiconductor structure 702. Laser energy adjusting unit 710 is provided to reduce or weaken the laser energy on the laser path. In some implementations, laser energy adjusting unit 710 may be a filter capable of reducing the laser energy output by laser source 704 and irradiated on semiconductor structure 702. In some implementations, laser energy adjusting unit 710 may be an optical device providing an additional laser light path. By providing the additional laser light path, the laser light path between laser source 704 and the semiconductor structure 702 is extended. In a situation that the laser energy output by laser source 704 is the same, the total laser light path between laser source 704 and the semiconductor structure 702 is extended, and therefore the laser energy irradiated on semiconductor structure 702 is weakened. In some implementations, laser energy adjusting unit 710 may be a mask or an optical grate that may block a portion of laser beam 706 to weaken the laser energy irradiated on semiconductor structure 702.

Positioning unit 712 is configured to move laser energy adjusting unit 710 to the laser light path or move laser energy adjusting unit 710 away from the laser light path. In some implementations, positioning unit 712 may be a motor rotationally moving laser energy adjusting unit 710 to or away from the laser light path. In some implementations, positioning unit 712 may be a shutter mechanism slidably moving laser energy adjusting unit 710 to or away from the laser light path.

Focusing unit 708 may be configured to focus laser beam 706 to form a series of focused laser spots. In some implementations, focusing unit 708 may include one or more focusing lens through which the focal plane of the laser beam 706 is determined at a desired position along the z-axis (e.g., the vertical direction). In some implementations, the one or more focusing lenses are electrically and mechanically coupled to a controller to control the arrangement (e.g., orientation and distance in between) of the one or more focusing lens to allow the focal plane of laser beam 706 to be located at the desired position along the z-axis. The series of focused laser spots can be formed on the focal plane, forming dicing trenches in semiconductor structure 702.

Figure 8:
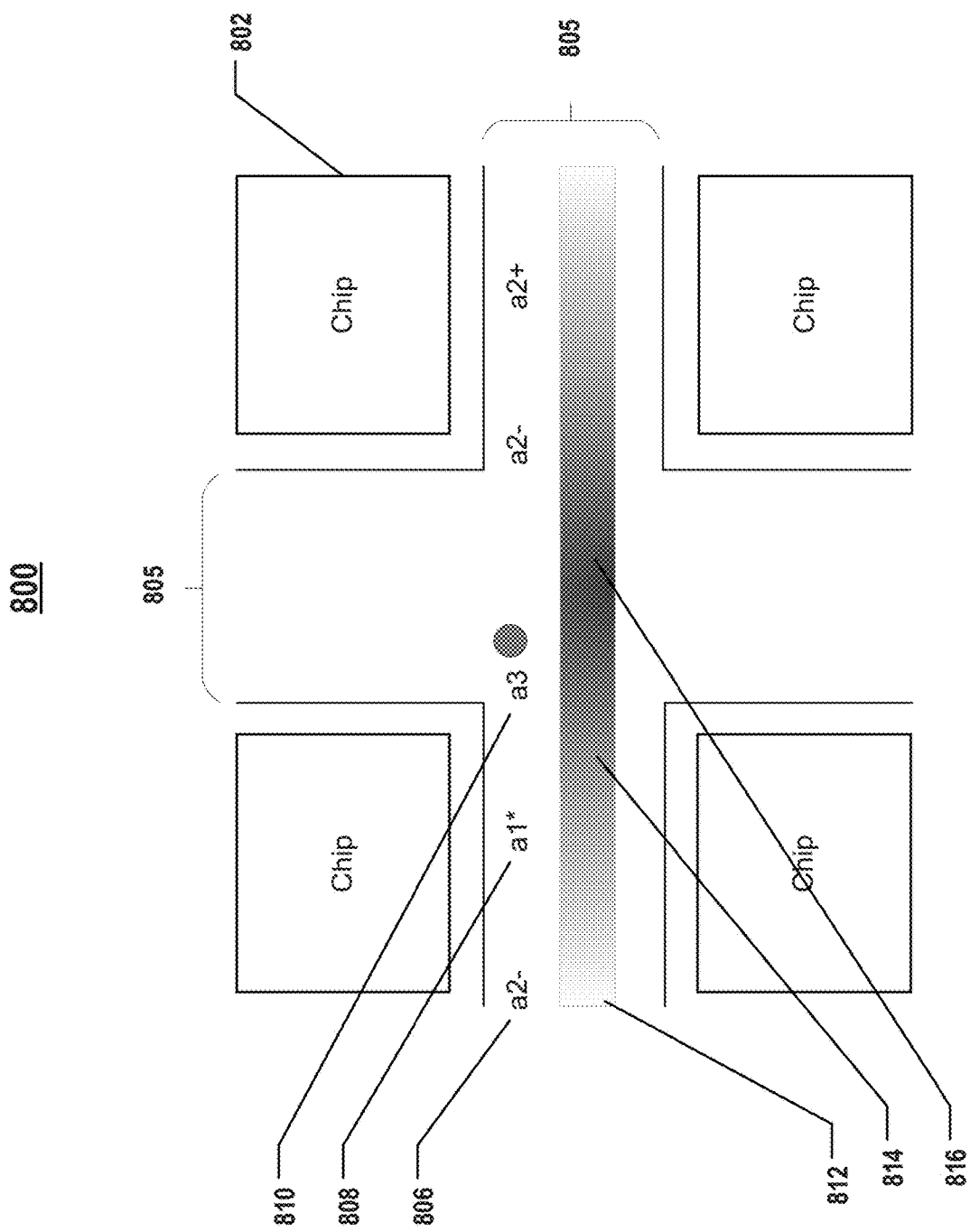
FIG. 8 illustrates a top view of an exemplary cutting street formed on a semiconductor structure, according to some implementations of the present disclosure.

FIG. 8 illustrates a top view of a cutting street 805 formed on a semiconductor structure, according to some implementations of the present disclosure. As shown in FIG. 8, marks 806, 808 and 810 may be formed on the surface of the semiconductor structure. Similar to laser dicing system 500 shown in FIG. 5, marks 806, 808, and 810 formed on the surface of the semiconductor structure are read by an image capture unit (e.g., 521 in FIG. 5). In some implementations, marks 806, 808, and 810 may be formed in an area between cutting street 805 and chips 802, e.g., between a seal ring and cutting street 805. After reading marks 806, 808, and 810, an image identification unit (e.g., 523 in FIG. 5) may identify the information embedded in marks 806, 808, and 810. Marks 806, 808, and 810 may be a letter, a number, a graphic, a symbol or other markings capable of embedding information. The information embedded in 806, 808, and 810 may indicate a material category of a corresponding position on the semiconductor structure. Hence, the laser source may perform the laser dicing operation according to the information.

As shown in FIG. 8, the laser source may perform the laser dicing operation at positions 812, 814, and 816 with a gradual laser energy adjustment. In other words, when the laser source moves from position 812 to position 814, or from position 814 to position 816, the laser dicing energy irradiated on the semiconductor structure, which is indicated by marks 806 and 808, or marks 808 and 810, is adjusted or changed gradually. The information embedded in marks 806, 808, and 810 indicates the material or the material category of positions 812, 814, and 816 on the semiconductor structure. The host device may calculate the gradual laser energy adjustment, and the laser source may perform the laser dicing operation accordingly.

Figure 9:
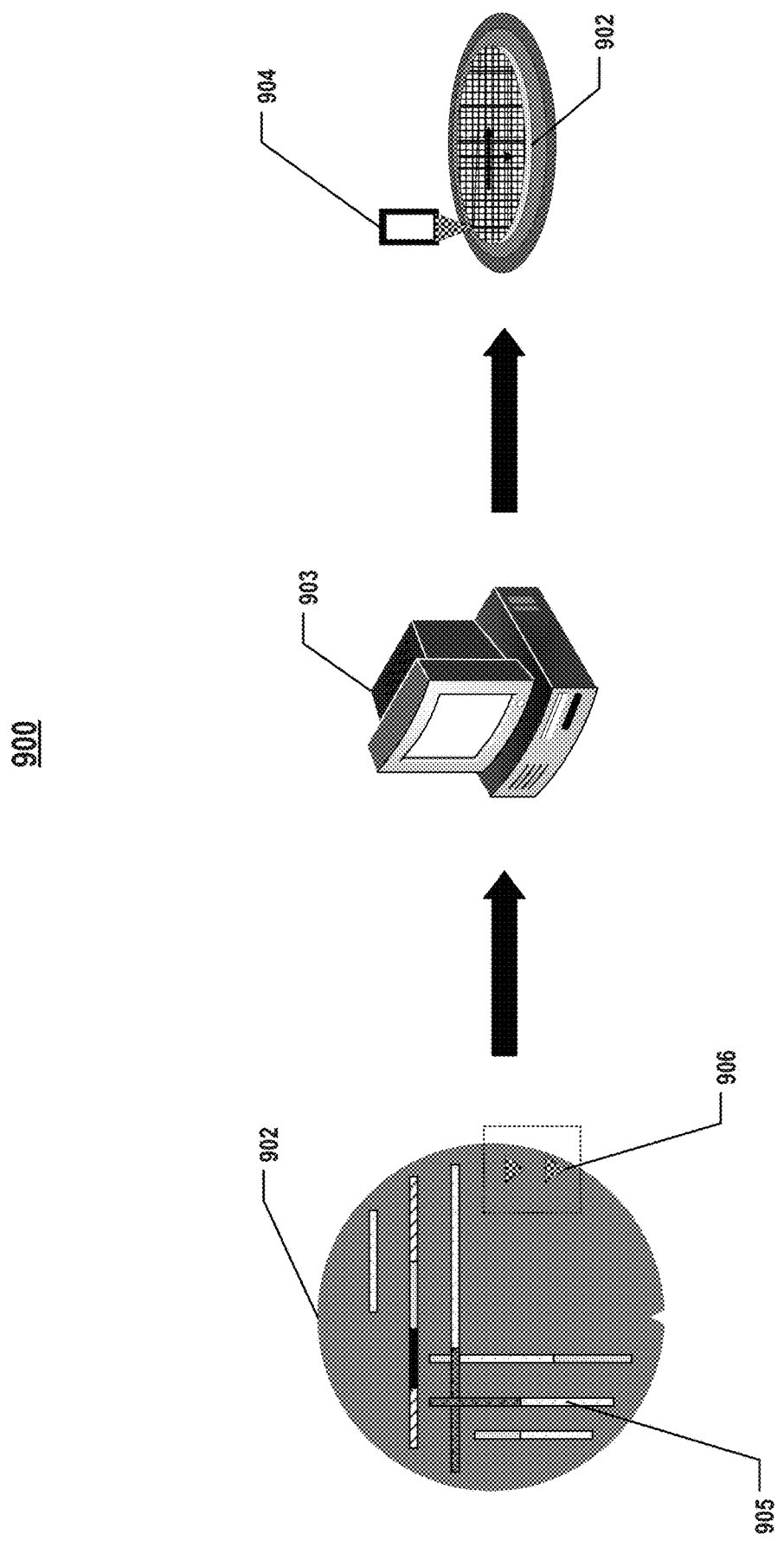
FIG. 9 illustrates a schematic diagram of another exemplary laser dicing system, according to some implementations of the present disclosure.
Figure 10:
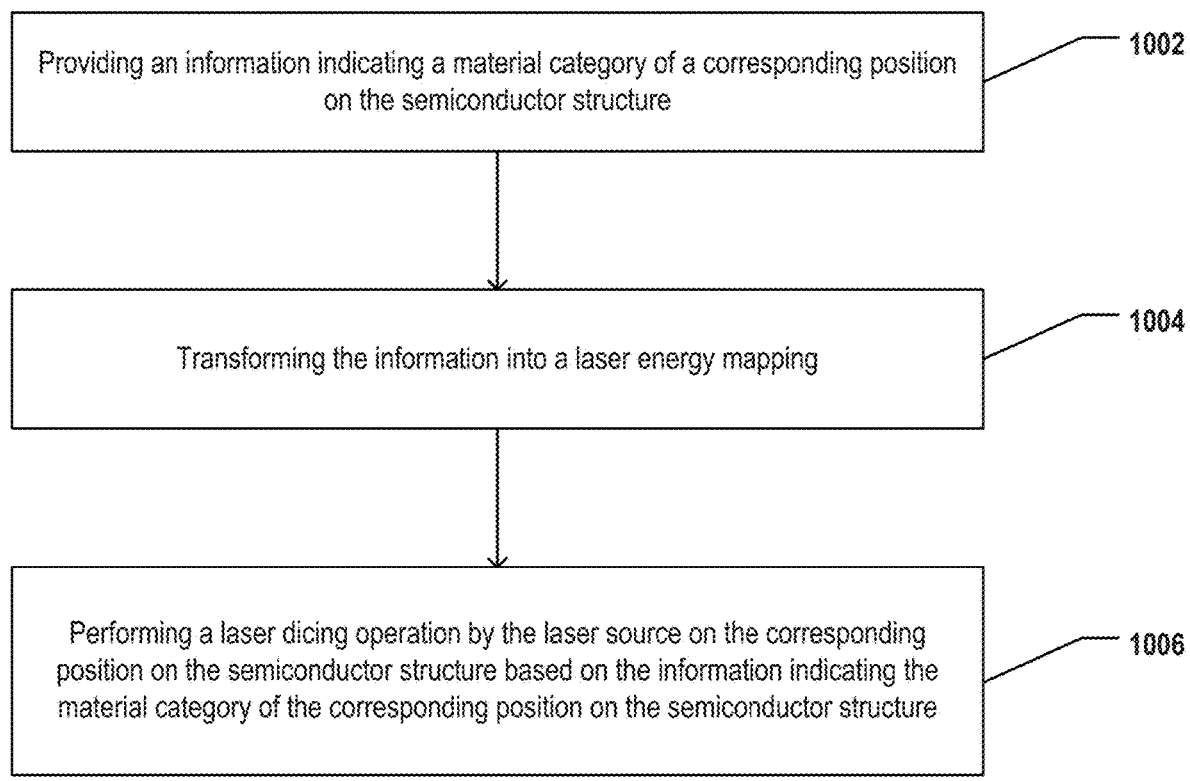
FIG. 10 illustrates a flowchart of another method for dicing a semiconductor structure, according to some aspects of the present disclosure.

FIG. 9 illustrates a schematic diagram of a laser dicing system 900, according to some implementations of the present disclosure. FIG. 10 illustrates a flowchart of a method 1000 for dicing a semiconductor structure, according to some aspects of the present disclosure. For the purpose of better explaining the present disclosure, laser dicing system 900 in FIG. 9 and method 1000 in FIG. 10 for dicing a semiconductor structure will be described together.

Laser dicing system 900 includes a host device 903 and a laser source 904. In some implementations, host device 903 may be similar to host device 103 in FIG. 1, and laser source 904 may be similar to laser source 104 in FIG. 1. Host device 903 may be coupled to laser source 904. Host device 903 may include an image capture unit to read a mark 906 formed on the surface of a semiconductor structure 902, e.g., a wafer, as shown in FIG. 9. Mark 906 may be embedded information indicating the material category of the corresponding position on semiconductor structure 902.

In some implementations, the information indicating the material category of the corresponding position on semiconductor structure 902 may be pre-stored in host device 903 before the laser dicing operation, as shown in operation 1002 of FIG. 10. In the mass production process, the material of each wafer is consistent. Therefore, the information indicating the material category of the corresponding position on each wafer should be consistent as well. The information may be pre-stored in host device 903 instead of directly reading from mark 906. In some implementations, the information pre-stored in host device 903 may include a position of a cutting street 905 on semiconductor structure 902, the material category along cutting street 905, a material density of each material of the material category, a laser energy for dicing each material of the material category, or other suitable information.

In some implementations, the information indicating the material category of the corresponding position on each wafer may be transformed or converted, to a laser energy mapping, as shown in operation 1004 of FIG. 10. A required laser energy to dice each cutting street 905 having various materials or metal densities is recorded in host device 903, and the information indicating the material category of the corresponding position on each wafer is transformed to the required laser energy. The laser energy mapping is then provided to laser source 904 in the form of the laser energy mapping. After positioning the wafer, laser source 904 may perform the laser dicing operation directly without reading mark 906, as shown in operation 1006 of FIG. 10.

Figure 11:
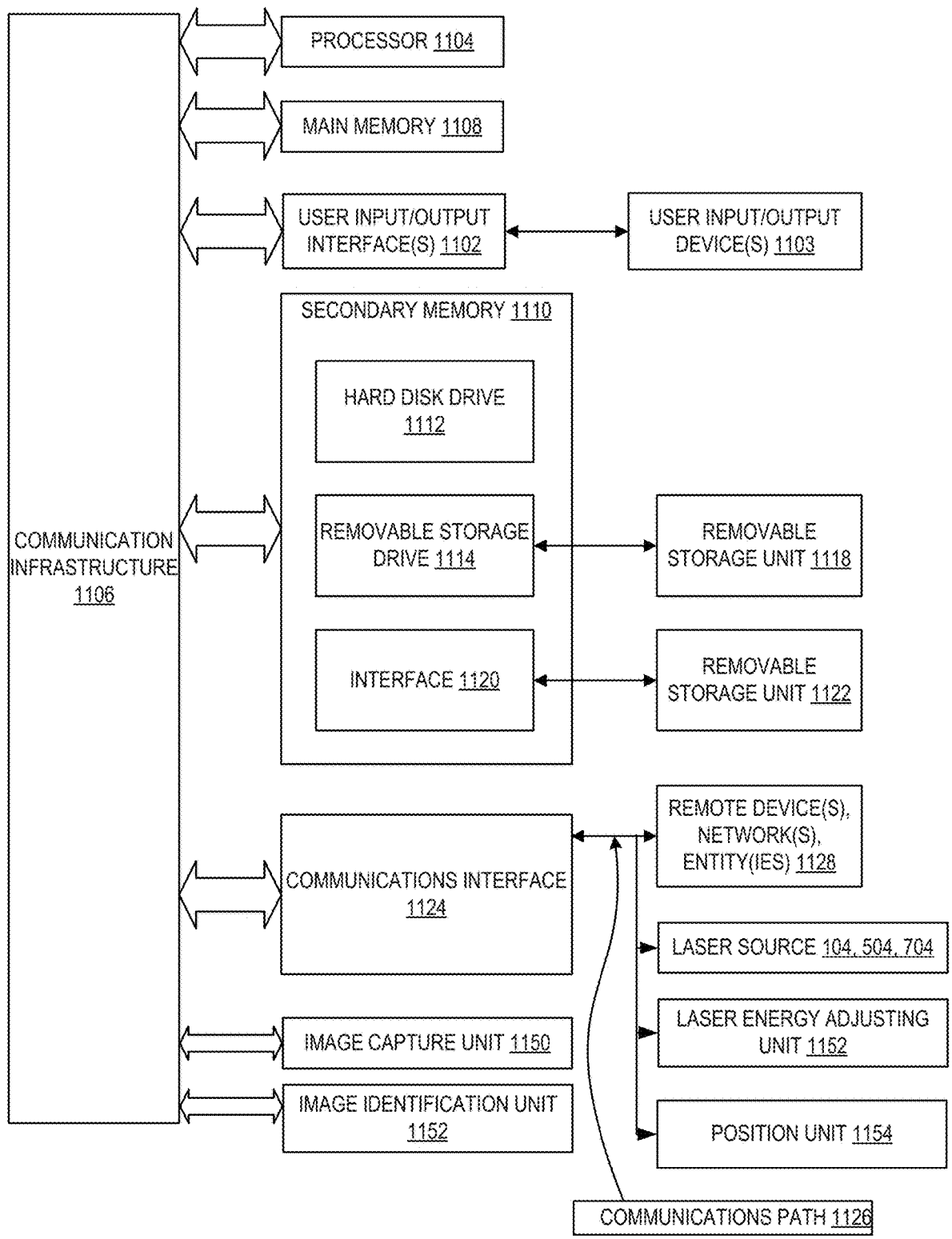
FIG. 11 illustrates a schematic diagram of an exemplary host device, according to some implementations of the present disclosure.

FIG. 11 illustrates a schematic diagram of a host device 1100, according to some implementations of the present disclosure. One or more host device 1100 can be an example of host device 103 in FIG. 1, host device 503 in FIG. 5, host device 703 in FIG. 7, or host device 903 in FIG. 9 to cooperate with the laser source to implement method 600 of FIG. 6 or method 1000 of FIG. 10. For example, host device 1100 can read the mark captured by an image capture unit 1150, identify the information embedded in the mark through an image identification unite 1152, and provide the information to the laser source. Image capture unit 1150 may be a camera, a scanner, a sensor, or other suitable devices for read marks. Image identification unit 1152 may identify the information embedded in marks.

Host device 1100 may also include one or more processors (also called central processing units, or CPUs), such as a processor 1104. Processor 1104 is connected to a communication infrastructure or bus 1106, according to some implementations. One or more processors 1104 can each be a GPU. In some implementations, a GPU is a processor that is a specialized electronic circuit designed to process mathematically intensive applications. The GPU may have a parallel structure that is efficient for parallel processing of large blocks of data, such as mathematically intensive data common to computer graphics applications, images, videos, etc. In some implementations, image identification unit 1152 may be included in processors 1104.

Host device 1100 may also include user input/output device(s) 1103, such as monitors, keyboards, pointing devices, etc., which communicate with communication infrastructure or bus 1106 through user input/output interface(s) 1102.

Host device 1100 may also include a main or primary memory 1108, such as random-access memory (RAM). Main memory 1108 can include one or more levels of cache. Main memory 1108 has stored therein control logic (i.e., computer software) and/or data, according to some implementations.

Host device 1100 may also include one or more secondary storage devices or memory 1110. Secondary memory 1110 can include, for example, a hard disk drive 1112 and/or a removable storage device or drive 1114. Removable storage drive 1114 can be a floppy disk drive, a magnetic tape drive, a compact disk drive, an optical storage device, tape backup device, and/or any other storage device/drive.

Removable storage drive 1114 can interact with a removable storage unit 1118. Removable storage unit 1118 includes a computer usable or readable storage device having stored thereon computer software (control logic) and/or data, according to some implementations. Removable storage unit 1118 can be a floppy disk, magnetic tape, compact disk, digital versatile disc (DVD), optical storage disk, and/any other computer data storage device. Removable storage drive 1114 can read from and/or writes to removable storage unit 1118 in a well-known manner.

According to some implementations, secondary memory 1110 can include other means, instrumentalities or other approaches for allowing computer programs and/or other instructions and/or data to be accessed by host device 1100. Such means, instrumentalities or other approaches may include, for example, a removable storage unit 1122 and an interface 1120. Examples of removable storage unit 1122 and interface 1120 can include a program cartridge and cartridge interface (such as that found in video game devices), a removable memory chip (such as an erasable programmable read-only memory (EPROM) or programmable read-only memory card and associated memory card slot, and/or any other removable storage unit and associated interface.

Host device 1100 may further include a communication or network interface 1124. Communication interface 1124 enables host device 1100 to communicate and interact with any combination of remote devices, remote networks, remote entities, etc. (individually and collectively referenced by reference number 1128), according to some implementations. For example, communication interface 1124 may allow host device 1100 to communicate with remote devices 1128 over communications path 1126, which may be wired and/or wireless, and which may include any combination of LANs, WANs, the Internet, etc. Control logic and/or data may be transmitted to and from host device 1100 via communication path 1126.

In some implementations, host device 1100 may include a laser energy adjusting unit 1152 and a positioning unit 1154. In other words, host device 1100, laser energy adjusting unit 1152 and positioning unit 1154 may be integrated in one device. After host device 1100 reads and identifies the information embedded in the mark via image capture unit 1150 and image identification unite 1152, processor 1104 may transmit a comment to positioning unit 1154 and/or laser energy adjusting unit 1152 through communication infrastructure or bus 1106.

Processor 1104 may control positioning unit 1154 to move laser energy adjusting unit 1152 to a processing position to perform the laser dicing operation. In some implementations, processor 1104 may also transmit a comment to laser source 104, 504 or 704 through communication interface 1124 to turn on/off laser source 104, 504 or 704.

In some implementations, laser energy adjusting unit 710 and positioning unit 712 in FIG. 7 may be independent devices and may include communication interface 1124 to communicated with host device 103, 503 or 703 or laser source 104, 504 or 704. After host device 103, 503 or 703 reads and identifies the information embedded in the mark via image capture unit 1150 and image identification unite 1152, host device 103, 503 or 703 may transmit a comment to laser energy adjusting unit 710 and/or positioning unit 712 accordingly. Positioning unit 712 may receive the comment through communication interface 1124 and move laser energy adjusting unit 710 to perform the laser dicing operation.

In some implementations, laser source 104, 504 or 704 may also include communication interface 1124 to communicated with host device 103, 503 or 703. After host device 103, 503 or 703 reads and identifies the information embedded in the mark via image capture unit 1150 and image identification unite 1152, host device 103, 503 or 703 may transmit a comment to laser source 104, 504 or 704 accordingly. Laser source 104, 504 or 704 may receive the comment through communication interface 1124 and generate the laser to perform the laser dicing operation.

According to one aspect of the present disclosure, a laser dicing system is disclosed. The laser dicing system includes a host device and a laser source. The host device reads and identifies a mark formed on a surface of a semiconductor structure. The laser source is coupled to the host device and is configured to generate a dicing laser energy to form a trench on the semiconductor structure. The dicing laser energy irradiated on the semiconductor structure is adjustable based on information embedded in the mark.

In some implementations, the information embedded in the mark includes a material category of a corresponding position on the semiconductor structure. In some implementations, the host device includes an image capture unit configured to read the mark formed on the surface of the semiconductor structure, and an image identification unit configured to identify the information embedded in the mark indicating the material category of the corresponding position on the semiconductor structure, and provide the information to the laser source.

In some implementations, the host device further includes a laser energy adjusting unit. The laser energy adjusting unit is movably provided on a laser light path between the laser source and the semiconductor structure based on the information identified by the image identification unit. The laser energy adjusting unit is moved to the laser light path between the laser source and the semiconductor structure when the laser source is focused on a first position on the semiconductor structure, and the first position is indicated by the information that has a first material category. In some implementations, the host device further includes a positioning unit receiving a comment from the host device to move the laser energy adjusting unit to the laser light path and move the laser energy adjusting unit away from the laser light path based on the information identified by the image identification unit.

In some implementations, a laser energy adjusting unit is coupled to the host device and is movably provided on a laser light path between the laser source and the semiconductor structure. The laser energy adjusting unit is moved to the laser light path between the laser source and the semiconductor structure when the laser source is focused on a first position on the semiconductor structure, and the first position is indicated by the information that has a first material category.

In some implementations, the laser energy adjusting unit is moved away from the laser light path when the laser source is focused on a second position on the semiconductor structure, and the second position is indicated by the information that has a second material category.

In some implementations, the first position and the second position are located along a cutting street on the semiconductor structure. In some implementations, a positioning unit is coupled to the host device and is configured to move the laser energy adjusting unit to the laser light path and move the laser energy adjusting unit away from the laser light path.

According to another aspect of the present disclosure, a laser dicing system is disclosed. The laser dicing system includes a host device and a laser source. The host device stores information indicating a material category of a corresponding position on the semiconductor structure. The laser source is coupled to the host device and is configured to generate a dicing laser energy to form a trench on the semiconductor structure. The dicing laser energy irradiated on the semiconductor structure is adjustable based on the information indicating the material category of the corresponding position on the semiconductor structure.

In some implementations, the information indicating the material category of the corresponding position on the semiconductor structure includes a position of a cutting street on the semiconductor structure, the material category along the cutting street, a material density of each material of the material category, or a laser energy for dicing each material of the material category. In some implementations, the host device reads and identifies a mark formed on a surface of the semiconductor structure, and provides the information indicating the material category of the corresponding position on the semiconductor structure to the laser source.

In some implementations, the host device includes an image capture unit to read the mark formed on the surface of the semiconductor structure, and an image identification unit to identify the information embedded in the mark indicating the material category of the corresponding position on the semiconductor structure, and provide the information to the laser source.

In some implementations, the host device further includes a laser energy adjusting unit. The laser energy adjusting unit is movably provided on a laser light path between the laser source and the semiconductor structure based on the information identified by the image identification unit. The laser energy adjusting unit is moved to the laser light path between the laser source and the semiconductor structure when the laser source is focused on a first position on the semiconductor structure, and the first position is indicated by the information that has a first material category. In some implementations, the host device further includes a positioning unit receiving a comment from the host device to move the laser energy adjusting unit to the laser light path and move the laser energy adjusting unit away from the laser light path based on the information identified by the image identification unit.

In some implementations, a laser energy adjusting unit is coupled to the host device and is movably provided on a laser light path between the laser source and the semiconductor structure. The laser energy adjusting unit is moved to the laser light path between the laser source and the semiconductor structure when the laser source is focused on a first position on the semiconductor structure, and the first position is indicated by the information that has a first material category.

In some implementations, the laser energy adjusting unit is moved away from the laser light path when the laser source is focused on a second position on the semiconductor structure, and the second position is indicated by the information that has a second material category.

In some implementations, the first position and the second position are located along a cutting street on the semiconductor structure. In some implementations, a positioning unit is coupled to the host device and is configured to move the laser energy adjusting unit to the laser light path and move the laser energy adjusting unit away from the laser light path.

According to still another aspect of the present disclosure, a method for dicing a semiconductor structure is disclosed. Information embedded in a mark formed on the semiconductor structure is read. The information indicates a material category of a corresponding position on the semiconductor structure. A laser dicing operation is performed based on the information indicating the material category of the corresponding position on the semiconductor structure.

In some implementations, the laser dicing operation is performed with a first dicing energy when the information indicating a first material category having a first hardness, and the laser dicing operation is performed with a second dicing energy when the information indicating a second material category having a second hardness. The first hardness is harder than the second hardness and the first dicing energy is larger than the second dicing energy.

In some implementations, the mark formed on the surface of the semiconductor structure is read, and the information embedded in the mark indicating the material category of the corresponding position on the semiconductor structure is identified.

In some implementations, a trench is formed on the semiconductor structure by a laser source along a cutting street. A dicing energy generated by the laser source and irradiated on the semiconductor structure is adjustable based on the information indicating the material category of the corresponding position on the semiconductor structure. In some implementations, a laser energy adjusting unit is provided movably equipped on a laser light path between the laser source and the semiconductor structure, and a position of the laser energy adjusting unit is changed to the laser light path or away from the laser light path based on the information indicating the material category of the corresponding position on the semiconductor structure.

In some implementations, the information is transformed into a laser energy mapping. In some implementations, the laser energy mapping includes a position of a cutting street on the semiconductor structure, the material category along the cutting street, a material density of each material of the material category, or a laser energy for dicing each material of the material category. In some implementations, the laser dicing operation is performed based on the laser energy mapping.

According to yet another aspect of the present disclosure, a method for dicing a semiconductor structure is disclosed. Information indicating a material category of a corresponding position on the semiconductor structure is provided to a laser source. A laser dicing operation is performed by the laser source on the corresponding position on the semiconductor structure based on the information indicating the material category of the corresponding position on the semiconductor structure.

In some implementations, the information is transformed into a laser energy mapping. In some implementations, the information indicating the material category of the corresponding position on the semiconductor structure is pre-stored in a host device.

In some implementations, the information indicating the material category of the corresponding position on the semiconductor structure is read from a mark formed on a surface of the semiconductor structure. In some implementations, the information indicating the material category of the corresponding position on the semiconductor structure includes a position of a cutting street on the semiconductor structure, the material category along the cutting street, a material density of each material of the material category, or a laser energy for dicing each material of the material category.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A laser dicing system, comprising:
a host device configured to read and identify a mark formed on a surface of a semiconductor structure; and
a laser source coupled to the host device and configured to generate a dicing laser energy to form a trench on the semiconductor structure,
wherein:
the dicing laser energy irradiated on the semiconductor structure is adjustable based on information embedded in the mark; and
in response to the laser source being focused on a first position different from a second position, the dicing laser energy irradiated on the semiconductor structure is reduced, the first position and the second position being located within a cutting street of the semiconductor structure.

2. The laser dicing system of claim 1, wherein the information embedded in the mark comprises a material category of a corresponding position on the semiconductor structure.

3. The laser dicing system of claim 2, wherein the host device comprises:
an image capture unit configured to read the mark formed on the surface of the semiconductor structure; and
an image identification unit configured to identify the information embedded in the mark indicating the material category of the corresponding position on the semiconductor structure, and provide the information to the laser source.

4. The laser dicing system of claim 3, wherein the host device further comprises:
a laser energy adjusting unit movably provided on a laser light path between the laser source and the semiconductor structure based on the information identified by the image identification unit,
wherein the laser energy adjusting unit is moved to the laser light path between the laser source and the semiconductor structure when the laser source is focused on the first position on the semiconductor structure, and the first position is indicated by the information that has a first material category.

5. The laser dicing system of claim 4, wherein the host device further comprises:
a positioning unit receiving a comment from the host device to move the laser energy adjusting unit to the laser light path and move the laser energy adjusting unit away from the laser light path based on the information identified by the image identification unit.

6. The laser dicing system of claim 1, further comprising:
a laser energy adjusting unit coupled to the host device and movably provided on a laser light path between the laser source and the semiconductor structure,
wherein the laser energy adjusting unit is moved to the laser light path between the laser source and the semiconductor structure when the laser source is focused on the first position on the semiconductor structure, and the first position is indicated by the information that has a first material category.

7. The laser dicing system of claim 6, wherein the laser energy adjusting unit is moved away from the laser light path when the laser source is focused on the second position on the semiconductor structure, and the second position is indicated by the information that has a second material category.

8. The laser dicing system of claim 7, wherein the first position and the second position are located along the cutting street on the semiconductor structure.

9. The laser dicing system of claim 6, further comprising:
a positioning unit coupled to the host device and configured to move the laser energy adjusting unit to the laser light path and move the laser energy adjusting unit away from the laser light path.

10. A laser dicing system, comprising:
a host device storing information indicating a material category of a corresponding position on a semiconductor structure; and
a laser source coupled to the host device and configured to generate a dicing laser energy to form a trench on the semiconductor structure,
wherein:
the dicing laser energy irradiated on the semiconductor structure is adjustable based on the information indicating the material category of the corresponding position on the semiconductor structure; and
in response to the laser source being focused on a first position different from a second position, the dicing laser energy irradiated on the semiconductor structure is reduced, the first position and the second position being located within a cutting street of the semiconductor structure.

11. The laser dicing system of claim 10, wherein the information indicating the material category of the corresponding position on the semiconductor structure comprises a position of the cutting street on the semiconductor structure, the material category along the cutting street, a material density of each material of the material category, or a laser energy for dicing each material of the material category.

12. The laser dicing system of claim 10, wherein the host device reads and identifies a mark formed on a surface of the semiconductor structure, and provides the information indicating the material category of the corresponding position on the semiconductor structure to the laser source.

13. The laser dicing system of claim 10, wherein the host device comprises:
   an image capture unit configured to read a mark formed on a surface of the semiconductor structure; and
   an image identification unit configured to identify the information embedded in the mark indicating the material category of the corresponding position on the semiconductor structure, and provide the information to the laser source.

14. The laser dicing system of claim 13, wherein the host device further comprises:
   a laser energy adjusting unit movably provided on a laser light path between the laser source and the semiconductor structure based on the information identified by the image identification unit,
   wherein the laser energy adjusting unit is moved to the laser light path between the laser source and the semiconductor structure when the laser source is focused on the first position on the semiconductor structure, and the first position is indicated by the information that has a first material category.

15. The laser dicing system of claim 14, wherein the host device further comprises:
   a positioning unit receiving a comment from the host device to move the laser energy adjusting unit to the laser light path and move the laser energy adjusting unit away from the laser light path based on the information identified by the image identification unit.

16. The laser dicing system of claim 10, further comprising:
   a laser energy adjusting unit coupled to the host device and movably provided on a laser light path between the laser source and the semiconductor structure,
   wherein the laser energy adjusting unit is moved to the laser light path between the laser source and the semiconductor structure when the laser source is focused on the first position on the semiconductor structure, and the first position is indicated by the information that has a first material category.

17. The laser dicing system of claim 16, wherein the laser energy adjusting unit is moved away from the laser light path when the laser source is focused on the second position on the semiconductor structure, and the second position is indicated by the information that has a second material category.

18. The laser dicing system of claim 17, wherein the first position and the second position are located along a cutting street on the semiconductor structure.

19. The laser dicing system of claim 16, further comprising:
   a positioning unit coupled to the host device and configured to move the laser energy adjusting unit to the laser light path and move the laser energy adjusting unit away from the laser light path.

20. A laser dicing system, comprising:
   a host device configured to read and identify a first mark and a second mark formed within a cutting street on a surface of a semiconductor structure; and
   a laser source coupled to the host device and configured to generate a dicing laser energy to form a trench on the semiconductor structure,
   wherein in response to the laser source being focused on a first position corresponding to the first mark, different from a second position corresponding to the second mark, a dicing laser energy irradiated on the semiconductor structure is reduced.

* * * * *